US 6,204,713 B1

(12) United States Patent
Adams et al.

(10) Patent No.: US 6,204,713 B1
(45) Date of Patent: Mar. 20, 2001

(54) METHOD AND APPARATUS FOR ROUTING LOW-SKEW CLOCK NETWORKS

(75) Inventors: Janice M. Adams; Keith M. Carrig, both of Jericho, VT (US); Roger P. Gregor, Endicott, NY (US); Daniel R. Menard, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/224,779

(22) Filed: Jan. 4, 1999

(51) Int. Cl.[7] ................................ G06F 1/04; H03K 3/00
(52) U.S. Cl. ............................................ 327/295; 327/293
(58) Field of Search ............................ 327/141, 291–293, 327/294, 295–299, 99; 326/93, 101; 395/560, 750

(56) References Cited

U.S. PATENT DOCUMENTS

| 5,923,188 | * | 7/1999 | Kametani et al. | 327/295 |
| 6,005,428 | * | 12/1999 | Amdahl | 327/161 |
| 6,037,820 | * | 3/2000 | Ishizaka | 327/295 |
| 6,043,704 | * | 3/2000 | Yoshitake | 327/565 |
| 6,081,148 | * | 6/2000 | Song | 327/295 |

* cited by examiner

Primary Examiner—My-Trang Nuton
(74) Attorney, Agent, or Firm—McGinn & Gibb, PLLC; Eugene I. Shkurko, Esq.

(57) ABSTRACT

An integrated circuit chip comprises a plurality of clock distribution sub-networks each including a clock input for receiving a clock signal, each of the clock distribution sub-networks having a capacitance, as seen from the clock input, substantially equivalent to others of the clock distribution sub-networks; and a structured clock buffer having a size based on a load of the clock distribution sub-networks, and providing the clock signal to the clock distribution sub-networks.

32 Claims, 6 Drawing Sheets

| REGION | MEAN (ps) | EARLY (ps) | LATE (ps) | LATE- EARLY (ps) |
|---|---|---|---|---|
| Subnet 0 | 80.5 | 79.4 | 81.8 | 2.4 |
| Subnet 1 | 105.2 | 103.0 | 107.3 | 4.3 |
| Subnet 2 | 90.4 | 89.0 | 91.5 | 2.5 |
| Subnet 3 | 97.0 | 93.4 | 99.4 | 6.0 |
| Subnet 4 | 100.8 | 97.4 | 102.7 | 5.3 |
| Subnet 5 | 94.4 | 93.6 | 95.4 | 1.8 |
| Subnet 6 | 82.9 | 81.3 | 85.0 | 3.7 |
| Subnet 7 | 97.7 | 93.7 | 100.6 | 6.9 |
| Total skew = 107.3 (latest) − 79.4 (earliest) = 27.9ps | | | | |

FIG.6

METHOD AND APPARATUS FOR ROUTING LOW-SKEW CLOCK NETWORKS

BACKGROUND OF THE INVENTION

1. Field of the Invention

The present invention generally relates to methods and structures for distributing clock signals within a semiconductor processor environment and, more particularly, to a methodology for growing and inserting clock trees on high-performance, low power application specific integrated circuit (ASIC) chips.

2. Description of the Related Art

Figure 1A:
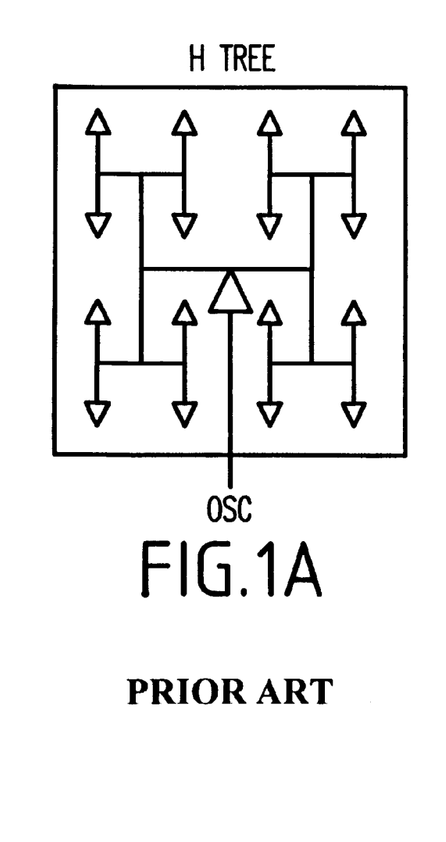
FIG. 1(a) is a schematic diagram of a conventional "H" tree.
Figure 1B:
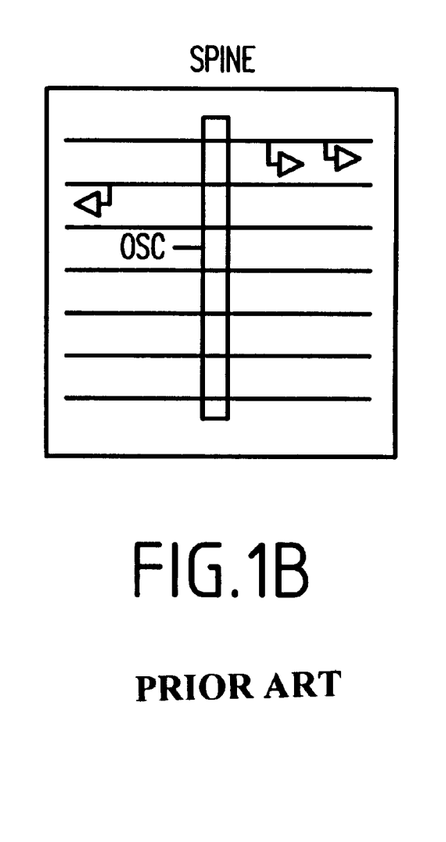
FIG. 1(b) is a schematic diagram of a conventional spine structure.
Figure 1C:
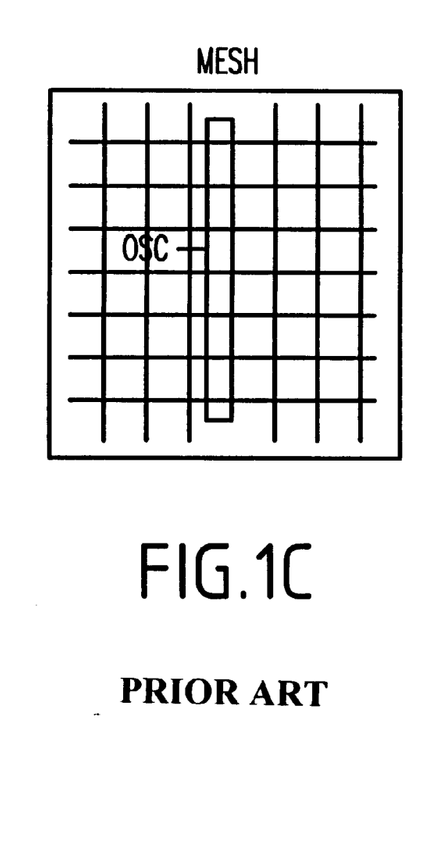
FIG. 1(c) is a schematic diagram of a conventional mesh layout.

Balanced clock distribution networks have historically fallen into four categories—meshes or grids, "H" or "I" trees, spines, and distributed buffers with or without balanced wiring. For example, FIG. 1(a) illustrates an "H" tree, FIG. 1(b) illustrates a spine structure and FIG. 1(c) illustrates a mesh layout.

Mesh or grid methods are often simple to lay out, but have greater amounts of wire and higher capacitance than is necessary, which increases power requirements and reduces wireability. This problem is compounded when multiple clock domains are required, which is very common in a large variety of ASICs.

The "H" or "I" trees tend to have wide wires at their roots. Such wide wires are more susceptible to inductance at high frequency, which limits the latency or performance of the clock distribution network.

Conventional "H" trees are often driven from a localized source, causing noise or power supply dips. Often, a special analysis must be performed or the power buses must be strengthened in those regions to eliminate the noise or power supply dips. These steps can delay design schedules and limit floor plan changes.

Electromigration problems are also aggravated by localized wiring and sources. Pure "H" or "I" trees can also add more wire than is necessary.

Additionally, spines, or fishbones, have resistance/capacitance (RC) drops across them, which causes undesirable clock skew. Distributed buffers (with or without balanced routing) suffer from process variations and added latency, increasing skew and decreasing performance.

Further, inductance effects often go unnoticed in narrow single wires because the resistance is much greater than the inductive-reactance term. For clock networks, however, wide wires are often used to reduce resistance. If the transition time is fast enough (as is typically required at higher frequencies), the inductive-reactance term becomes significant with respect to the resistance. If this inductance is not considered, large errors in delays can result.

The following table shows the delay measured across a 10 mm wire segment with a 200 ps transition time input to the circuit. The delay is modeled, first without using inductance and then including inductance effects. The results presented in the following table show that the wire can be as much as 130 ps slower when inductance is considered.

| Wire Width ($\mu$m) | RC Delay (ps) | RLC Delay (ps) | Difference (ps) |
| --- | --- | --- | --- |
| 0.9 | 406.0 | 406.0 | 0 |
| 50 | 206.3 | 336.0 | 130 |

The difference in latency can result in skew if wide wires are used on some networks and narrow wires are used on other networks. Wide wires can have additional delay differences if return paths are not modeled correctly.

SUMMARY OF THE INVENTION

It is, therefore, an object of the present invention to provide a structure and method for designing a clock distribution network which does not add unnecessary wiring, avoids power supply drops (which is commonly associated with localized high-current-density clock circuits) and reduces high-frequency effects, such as inductance. The invention works on a large variety of chip sizes, package types, latch counts and operating frequencies. The invention allows a complete automated design of the clock network, including verification.

More specifically, the invention includes an integrated circuit chip comprising a plurality of first clock distribution sub-networks each including a first clock input for receiving a clock signal, each of the first clock distribution sub-networks having a first capacitance, as seen from the first clock input, substantially equivalent to others of the first clock distribution sub-networks, at least one first structured clock buffer having a first size based on a first load of the first clock distribution sub-networks, a first input pin, a first output pin and providing the clock signal to the first clock distribution sub-networks, the first clock input of each of the first clock distribution sub-networks being connected to the first output pin of the first structured clock buffer at generally equally spaced intervals along the first output pin measured from each other and from ends of the first output pin, a plurality of second clock distribution sub-networks each including, a second clock input for receiving the clock signal, each of the second clock distribution sub-networks having a second capacitance, as seen from the second clock input, substantially equivalent to others of the second clock distribution sub-networks, at least one second structured clock buffer having, a second size based on a second load of the second clock distribution sub-networks, a second output pin, a second input pin, and providing the clock signal to the second clock distribution sub-networks, the second clock input of each of the second clock distribution sub-networks being connected to the second output pin of the second structured clock buffer at generally equally spaced intervals along the second output pin measured from each other and from ends of the second output pin, and at least one third structured clock buffer having a third size, a third output pin, and providing the clock signal to the first structured clock buffer and the second structured clock buffer, the first input pin of the first structured clock buffer and the second input pin of the second structured clock buffer being, connected to the third output pin of the third structured clock buffer at generally equally spaced intervals along the third output pin measured from each other and from ends of the third output pin.

The first clock input comprises a single clock input and the second clock input comprises a single clock input. The first output pin comprises a single output pin and the first output pin extends along a length of the first structured clock buffer, the second output pin comprises a single output pin and the second output pin extends along a length of the second structured clock buffer, and the third output pin comprises a single output pin and the third output pin extends along a length of the third structured clock buffer.

The inventive integrated circuit chip includes a power grid, wherein the first structured clock buffer, the second structured clock buffer and the third structured clock buffer utilize an unmodified version of the power grid to drive the clock distribution sub-networks.

The first clock distribution sub-networks and the second clock distribution sub-networks each include at least one group of master and slave latches and at least one group of splitters for supplying the clock signal to a corresponding one of the at least one group of master and slave latches.

The first structured clock buffer has a first delay, the second structured clock buffer has the first delay and the third structured clock buffer has the first delay.

The invention also includes a scaleable structured clock buffer for driving clock distribution sub-networks, the structured clock buffer comprising at least one kernel comprising serially connected buffers and nodes positioned between the buffers and a number of the at least one kernel included within the structured clock buffer being based on a load of the clock distribution sub-networks to be driven by the structured clock buffer.

Each of the at least one kernel includes four serially connected buffers. The buffers comprise inverters. The structured clock buffer includes an output pin for connecting to the clock distribution sub-networks, wherein the output pin extends along a length of the structured clock buffer. The number of buffers included within each of the at least one kernel establishes a delay of the scaleable structured clock buffer.

The invention also includes a method of designing a clock distribution network comprising steps of identifying characteristics of structures within a circuit, organizing the structures into balanced clock distribution sub-networks, grouping the clock distribution sub-networks, to form at least one clock distribution network, assigning a structured clock buffer to each of the at least one clock distribution network, and sizing the structured clock buffer based on a load of a corresponding one of the at least one clock distribution network.

The identifying step, the organizing step, the grouping step, the assigning step and the sizing step are performed utilizing at least one automated planning program. The organizing step comprises a step of balancing the sub-networks according to a capacitance of the structures within the sub-networks. The sizing step comprises a step of defining a number of kernels within the structured clock buffer to match the load, wherein the kernels comprise serially connected buffers. The organizing step comprises steps of assigning master and slave circuits to the structures and assigning splitters to the master and slave circuits. The method also includes a step of defining connections between the structured clock buffer and an unmodified power grid. The identifying step comprises a step of identifying latency and capacitance characteristics of the structures.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Application specific integrated circuits (ASICs) are generally produced in smaller numbers when compared to standardized integrated circuits because of their application specific nature. Thus, the design cost per unit produced is higher for ASICs than for more standardized integrated circuits.

The design of the clock distribution networks for ASICs contributes a large amount to this design cost. Traditionally, designers of ASIC products have preferred distributed clock trees because of their flexibility. More specifically, the flexibility afforded by clock distribution trees reduces the design time and the accompanying design cost of ASICs.

However, as mentioned above, distributed clock trees present the designer with the disadvantages associated with a large number of stages which causes increased clock skew due to process variation and increased latency. Therefore, conventional clock network design presented a tradeoff between design cost and circuit complexity/performance. Often, because of the uniqueness of many ASICs associated with their application specific nature and low production numbers, designers chose to decrease circuit performance in order to reduce development costs.

The invention avoids such conventional tradeoffs by providing automated design flexibility while reducing skew and avoiding the power and wireability penalties associated with excessive wiring. The invention includes a generalized methodology that works across a wide array of chip designs and styles. The clock-distribution scheme described below can serve a large number of macro cells and cores along with greater than 40,000 master/slave latch pairs in either a flat or hierarchical environment. The invention also balances large domains and small domains on the same chip.

Figure 2:
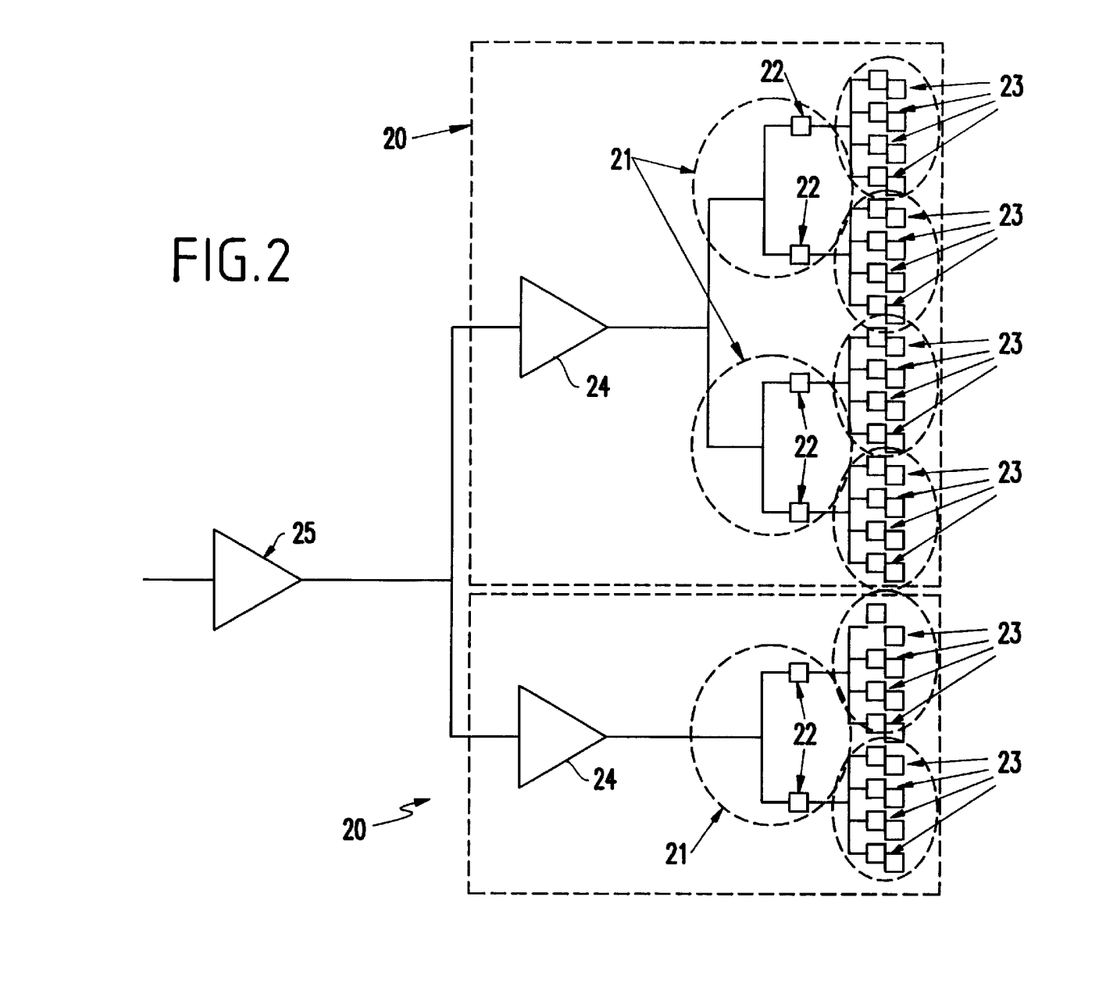
FIG. 2 is a schematic diagram of a clock distribution network according to the invention.

Referring now to FIG. 2, a preferred embodiment of the invention is illustrated. The invention divides the circuit into clock distribution networks 20 and sub-networks 21. Each of the sub-networks 21 includes multiple master/slave latches 23 each connected to a single splitter 22. Each of the splitters 22 for the sub-networks are connected to a structured clock buffer (SCB).

Depending upon the size of the clock distribution network required, the networks 20 can be connected to a higher level structured clock buffer 25. More specifically, each of the individual structured clock buffers 24 within each of the clock distribution networks is connected to a main structured clock buffer 25.

As would be known by one ordinarily skilled in the art given this disclosure, the hierarchical structure discussed above could be scaled to accommodate any size circuit. For example, if the design is small enough (less than 40,000 latches) and the frequency is low enough (less than 150 Mhz), the distribution tree can be simplified to a two-stage tree comprising one large structured clock buffer 24 feeding the clock splitters 22 which then drive master/slave latch pairs 23. For designs with high latch-pair counts or high frequency, the distribution may require two stages of structured clock buffers 24, 25, as illustrated in FIG. 2.

In a hierarchical design, it may be most appropriate to use one structured clock buffer per entity. In this regard, a physical entity is a collection of random logic circuits placed together on the die as a group. With the invention, different-size entities can use different-sized structured clock buffers without adding skew. Another structured clock buffer stage 25 can then be used to drive these entities. By using different sized structured clock buffers, the invention balances power consumption within the circuit, reducing wiring thickness. However, as discussed in greater detail below, the different sized structured clock buffers all produce the same delay.

More specifically, the invention matches the size of the structured clock buffer 24 to the requirements of the each of the sub-networks 21. Further, the sub-networks 21 are balanced with respect to capacitance and delay, such that the clock signals supplied by the structured clock buffer 24 will be distributed, without skew, to each of the splitters 22. The splitters 22 then divide the clock signal (and a corresponding secondary clock signal, depending upon design requirements) to the master/slaves circuits 23. A single phase is distributed per tree for most of the tree, then the splitter 22 produces two level-sensitive master and slave latch clocks. The splitter 22 includes independent control of its clock outputs, and an input to disable or gate the clock to save power.

Key features of the invention include the division of the circuit into balanced sub-networks (having the same capacitance and delay characteristics) and the use of different sized structured clock buffers to precisely match the requirements of each of the sub-networks. In other words, the invention surveys the clock requirements of a given circuit and, based on the survey, divides the circuit into sub-networks, each of which is balanced with respect to capacitance and latency within a given network. The invention also utilizes different sized structured clock buffers for each of the networks, depending on the networks specific characteristics.

By dividing each clock distribution network 20 into sub-networks 21, sensitivity to inductive reactance is reduced and the need to model return paths is eliminated, without modifying the power-bus structure.

Figure 3:
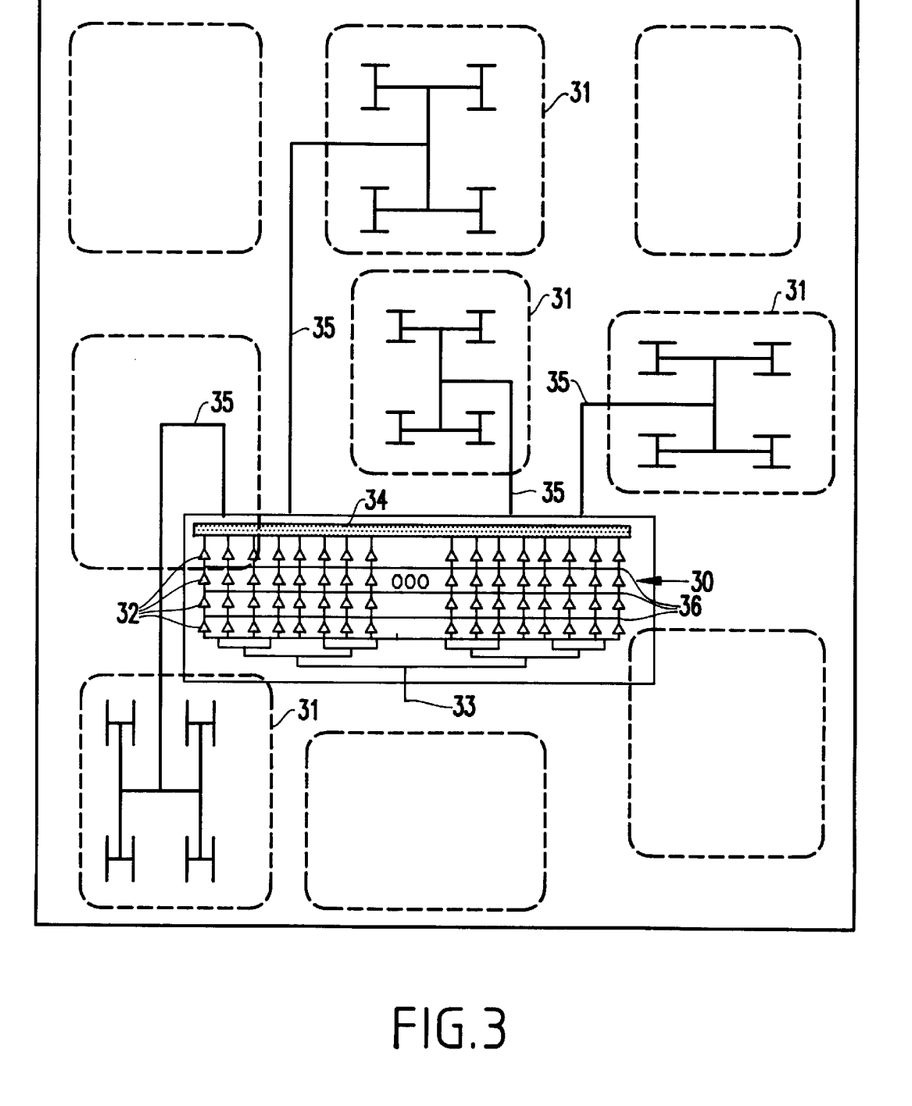
FIG. 3 is a schematic diagram of a clock distribution network according to the invention.

Referring now to FIG. 3, a schematic diagram of the internal components of the inventive structured clock buffer 30 and its connections to the sub-networks 31 is illustrated in greater detail. The structured clock buffer 30, includes multiple strings of serially connected inverters (buffers) 32, referred to herein as "kernels".

In a preferred embodiment, the kernels 32 includes four inverters. However, as long as the kernels are identical in each structured clock buffer, the structured clock buffer could include any number of serially connected inverters in each kernel, depending upon the design requirements. The kernels are connected to a first end of the structured clock buffer 33 by a multiple-level balanced wiring tree.

The wiring within each structured clock buffer comprises a balanced tree. In one embodiment, each stage within the structured clock buffer could be connected together (e.g., shorted) with metal straps 36 if balancing is more important than space limitations. However, if space limitations are paramount, the straps 36 can be, and preferably are, omitted. The final metal strap is an output pin 34. The size of the structured clock buffer is increased or decreased by increasing or decreasing the number of kernels 32.

The sub-networks 31 are connected to the structured clock buffer by way of the single output pin 34. The structured clock buffer is designed so that the pin 34 is wide enough to easily attach connecting lines 35 to each of the sub-networks and to maintain sufficient spacing between each of the connections to the pin 34. A single wire with a maximum width of less than 20 um runs from the output pin 34 to each sub-network 31.

The use of a single pin (metal strap) for shorting the final outputs of the kernels reduces any device process variations across the structured clock buffer and also allows for some capacitance imbalance to occur along its output.

The sub-networks 31 are driven by the structured clock buffer 30 and tapped into the structured clock buffer's elongated output pin 34, at equally spaced intervals. Even though wires at the trunk are limited in width to less than 20 um, the number of sub-networks 31 may cause congestion at the source. Therefore, the output pin should be long-enough to provide sufficient area for the sub-networks 31 to tap in. On high-performance parts, this is typically not a concern since electromigration constraints have already required a larger driver.

In a preferred embodiment, the kernels 32 are as wide as the pitch of the second metalization layer (M2) of the circuit supply buses (not illustrated). For example, a structured clock buffer comprising two kernels takes up two current supply pitches and a structured clock buffer comprising three kernels takes up three current supply pitches.

The four series inverters making up a kernel have an output defined by the amount of capacitance the supply grid can drive, for example at 300 MHZ with a 300 ps transition. In a preferred embodiment, a structured clock buffer could include 160 kernels and drive 300 pF and be 6.45 mm wide.

Figure 4:
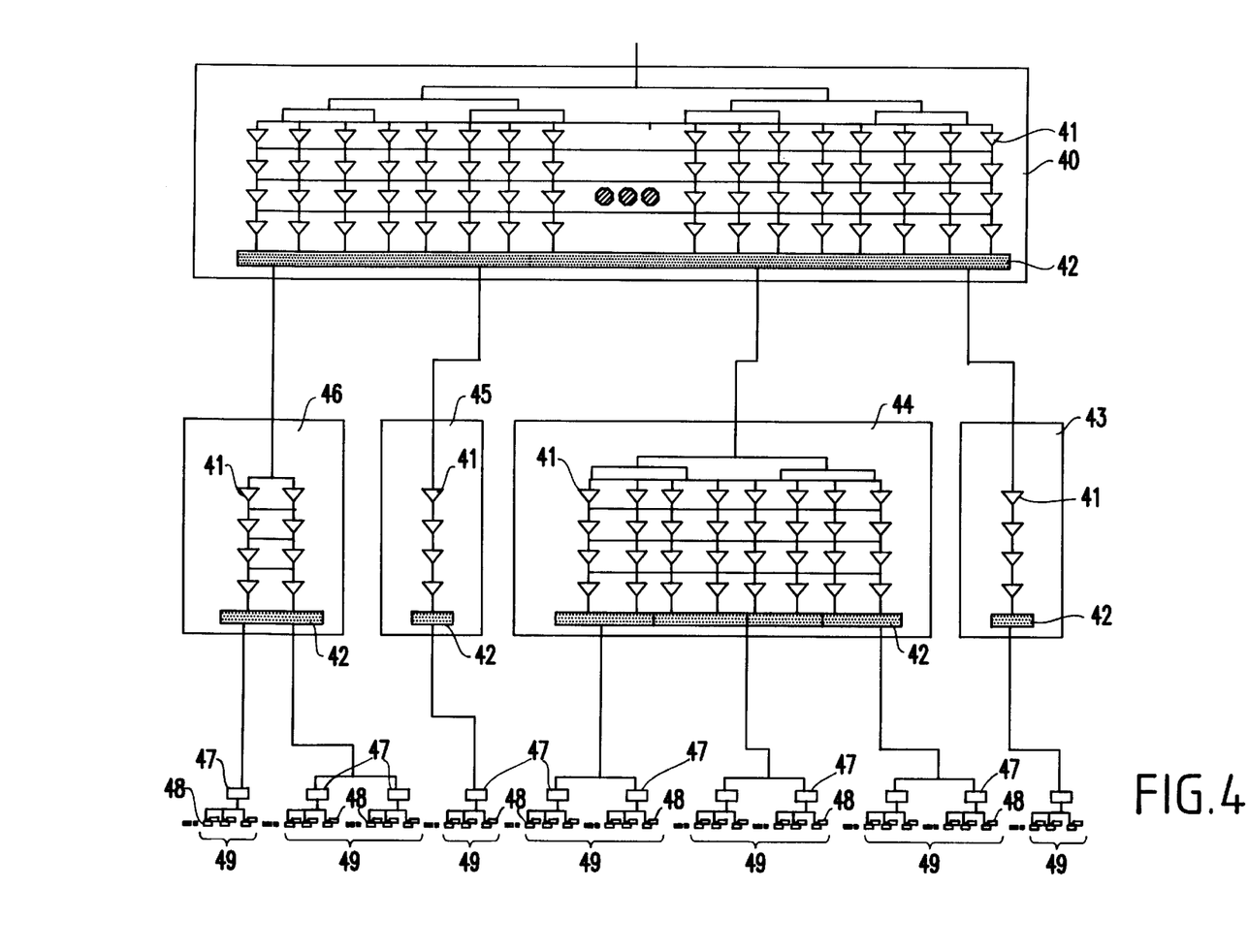
FIG. 4 is a schematic diagram of a clock distribution network according to the invention.

The kernels are used multiple times for higher drive strengths (as shown in FIG. 4), with their inputs connected by, for example, a three-level tree 33, and their outputs tied together with a wide first metalization layer (M1) output strap 34.

The four inverters provide very low input capacitance and can tune out the sensitivity to input slew, output load, and NMOS to PMOS gain. The input tree, the wide output wire, and the distributed output loading minimize sources of skew except for an end-to-end skew that could occur with a systematic process skew along such a wide output. This skew does not present a system problem for the invention because the latches that are driven from different ends of the structured clock buffer are relatively far apart. The transit time between two distant latches is also long, so early-mode (race) conditions will not occur. Likewise, a slow path between two distant latches would typically see the same process speedup as the structured clock buffer sees, thus minimizing any concern of slow paths.

In a preferred embodiment, to minimize any impact on placement or wiring, the entire structured clock buffer may be built using only the M1 level of wiring. In such a preferred structure, electromigration and noise are contained because each kernel spans a new set of M2 supply buses.

FIG. 4 illustrates a two level clock network according to the invention which includes a primary structured clock buffer 40 having kernels 41 and a pin 42. FIG. 4 also illustrates four secondary structured clock buffers 43–46 connected to the pin 42 of the primary structured clock buffer 40.

As illustrated in FIG. 4, the secondary structured clock buffers 43–46 have different sizes to accommodate the different load requirements of the sub-networks 49. More specifically, the structured clock buffer 44 is the largest of the secondary structured clock buffers in this example and includes eight kernels 41. Structured clock buffers 43 and 45, of the secondary structured clock buffers include a single kernel and structured clock buffer 46 includes two kernels.

Despite having different sizes, all the structured clock buffers 40, 43–46 shown in FIG. 4 have the same delay because the delay is based upon the number of inverters within a given kernel and not upon the number of kernels within a structured clock buffer.

The inventive methodology for an automated system to design the foregoing inventive structure begins with defining the power stages and latency targets of the circuit. The latency targets can be specified by the designer or automatically calculated using a clock-planning tool.

For example, a commercially available clock planning tool which automates the design of the power stages is distributed under the brand name "ClockPro" and is manufactured by International Business Machines Corp., Armonk, N.Y., USA.

The clock planning tool should preferably be customized with a new wiring algorithm corresponding to the wiring tool utilized, using methods well known to those ordinarily skilled in the art. Further, electromigration should be checked using well known methods and procedures.

As explained above, the structured clock buffers are scalable and, therefore, have a wide range of drive capability and simplify the clock-planning process by reducing the number of re-powering stages for large clock domains. Further, the wide range drive capability of the structured clock buffers provides similar delays when attempting to minimize skew across multiple clock domains that vary in size (latch count and area).

After the power stages are designed with the clock-planning program, the placement and power-bus routing are performed using techniques well known to those ordinarily skilled in the art. Detailed discussion on the placements and power-bus routing is not included herein, for the sake of brevity.

The clock network is optimized by first performing a clock trace to identify the clock-tree structure and define equivalent clock distribution networks with sinks (e.g., load circuit of the driving (source) clock circuit) that can be interchanged during optimization.

Next an automated clock-optimization tool which assigns latches to a nearby splitter and assigns a group of splitters to temporary buffers (inserted to define the sub-networks connectivity) is used for physical-placement clock-optimization. Clock-optimization tools are commercially available under, for example, the trade names ClockOpt, C02 or ClockDesigner which are manufactured by International Business Machines Corp, Armonk, N.Y., USA.

An algorithm that averages the distance from the structured clock buffer pin 34 to the centroid of each sub-network is preferably used to assign a connection location on the structured clock buffer's 30 output pin 34 for each of the sub-networks. The algorithm measures locations from each centroid to each pin location in a series of nested do loops.

More specifically, for each centroid, a pin location do loop is performed until all centroids have been evaluated. Each pin location do loop includes steps of calculating the distance from the centroid to the structured clock buffer pin and minimizing the variance of the distances between the centroid and the structured clock buffer output pin. For example, the variance of the distances can be minimized by eliminating the largest and smallest distances, which allows the remaining distances to be closer to the average distance. With such an algorithm, the optimum connection location of each pin can be automatically calculated.

An automated clock wire routing method is then used to eliminate resistance/capacitance (RC) variation, limit inductive reactance effects at high frequencies, and allow reduced power without causing an undue negative impact upon wireability.

For example, a wiring tool such as CLOCKTREE described in K. M. Carrig et al. "A Clock Methodology for High-performance Microprocessors" in *Proc. IEEE Custom Integrated Circuits Conference,* May 1997, pp. 119–122, and disclosed in co-pending U.S. patent application Ser. No. 08/934,995 (both of which are incorporated herein by reference) is a balanced router that uses two layers of metal and varies the width of each wire segment. CLOCKTREE is target-driven, thus, by driving each of the sub-networks to the same target, the sub-networks 21 are also balanced to one another. CLOCKTREE can also be used to compensate for delay differences between different-sized structured clock buffer circuits by specifying appropriate delay targets for sub-networks or secondary structured clock buffers.

The wiring tool routes the clock wires, driving toward a latency target specified by ClockPro or the designer. The wiring tool also provides the designer with skew, latency and capacitance values from its simulations, so the wiring solution can be verified.

An advantage of using a clock router such as CLOCKTREE is that CLOCKTREE may select wires of any width while optimizing. These wires are later "trimmed", using processes well known to those ordinarily skilled in the art, to match existing wire widths.

Further, to maintain the skew numbers set by the clock router, a sufficient granularity of wire widths should be made available to the trimming tool. For example, by adding only one or two wire widths to the set of those available in the most common design libraries, post-trimmed skew values can be significantly reduced.

The remaining detailed wiring of the chip is then completed and final checking is performed. An automated power calculation tool, such as EinsTimer manufactured by International Business Machines Corp., Armonk, N.Y., USA, provides the final timing and power calculations.

If the structured clock buffer is to drive a very-large-fanout clock tree and still meet the technology's noise and reliability requirements, additional physical design (including supply decoupling) could be added to the circuit to bring sufficiently wide power-bus supply wires into a centralized structured clock buffer or the structured clock buffer could be spread out so that the normal power grid could handle the peak and average current. Increasing the width of the power-bus supply wires could be accomplished using a number of methods well known to those ordinarily skilled and the art, and will not be discussed in detail herein for the sake of brevity. However, preferably a power calculation tool could be used to spread out the structured clock buffer.

More specifically, each of the structured clock buffers can be connected to multiple power rails, if necessary to spread out the structured clock buffer and to assist in handling peak and average currents. Within each structured clock buffer, the kernels are consistently connected to the power rails. Therefore, every kernel within a given structured clock buffer will be attached to the same number of power rails. Thus, if one kernel is connected to one-half a power rail (or one or multiple power rails) all kernels within that structured clock buffer will be similarly connected to the same number of power rails.

The inventive clock tree component design also considers reliability (electromigration), noise, and chip wireability limitations as well as the usual concerns of N-type metal oxide semiconductor (NMOS) to P-type metal oxide semiconductor (PMOS) gain insensitivity, and balanced response to variations in output load and input slew.

A level-sensitive scan design (LSSD) clock methodology requires that a clock-splitter component be used. The splitter produces two level-sensitive master and slave latch clocks from a single edge clock and includes independent control of clock outputs. This provides both a high-performance functional clock and independent master and slave clocks for testing.

Data from previous designs showed that over 90% of the power dissipation in the clock trees is caused by power dissipation in the leaves of the each tree (splitters and latches) and the wiring between the leaves. Thus, the inventive clock power reduction methodology requires that the latches have a very low capacitance related to clock switching.

The desire to reduce power consumption, along with the required independence of the master and slave clocks for LSSD, makes it advantageous to use only NMOS transistors within the latches of the invention. The power savings and potential improvements in skew and noise compensate for the loss in performance associated with using only NMOS transistors within the latches.

The inventors have also found that an optimum grouping of latches for a given splitter is 10–20 latches. For example, the splitters used with the invention could drive 16 latches at a 200 PS transition even under worst-case conditions.

The LSSD clocks and an input to disable the clocks is also included in the inventive structure. This disabling structure (gating) is positioned in the first stage of the splitters to eliminate all of the splitter's power consumption when the clock is disabled (gated off). Device sizes of the clock input are also minimized to reduce the loading on the driving stage.

The invention is applicable to both flat and hierarchical ASIC chips. For example, the invention would work well in a 0.25 um (Leff=0.18 um), 2.5 V CMOS technology with five levels of metal including four global wiring levels and one local interconnection level.

Figure 5:
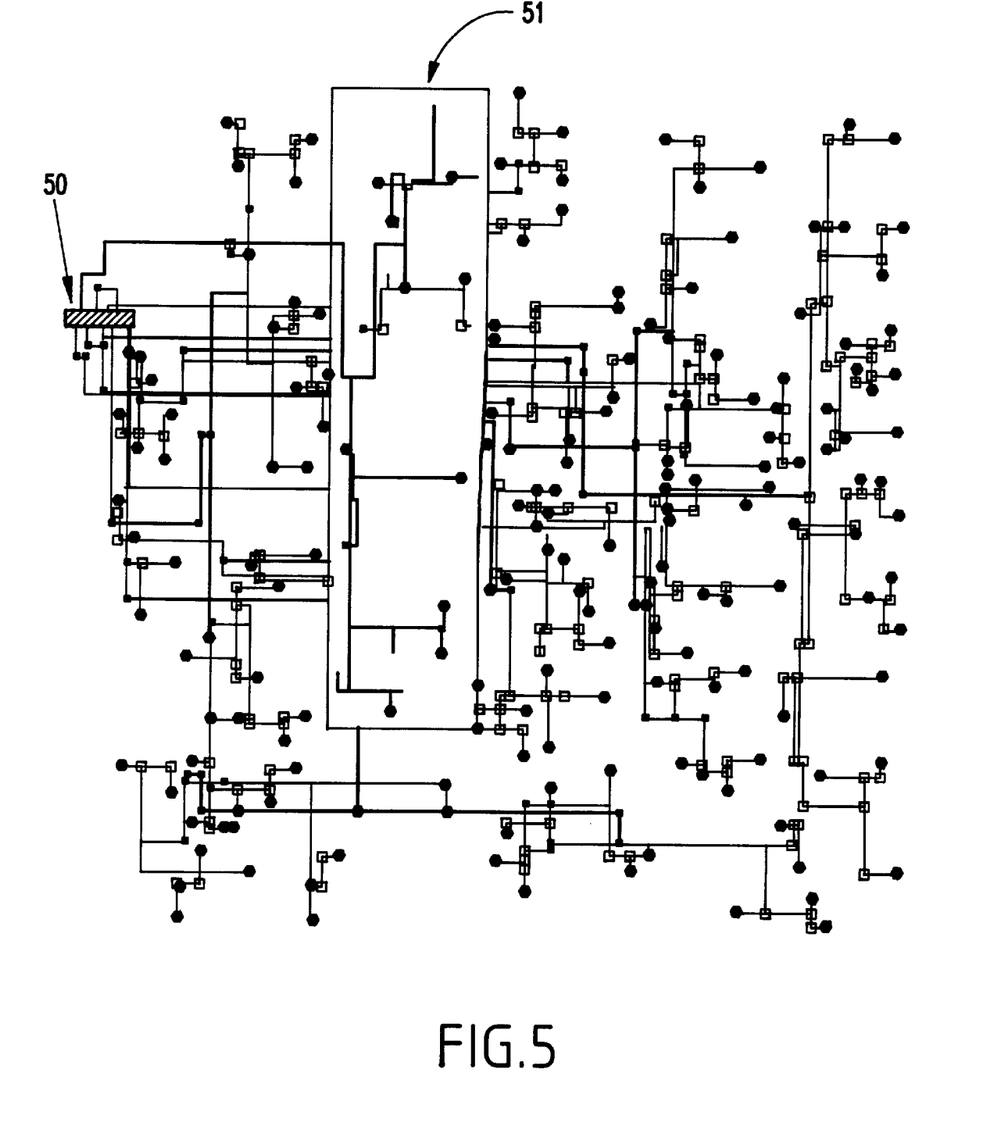
FIG. 5 is a schematic diagram of a clock distribution network according to the invention.

FIG. 5 illustrates all routed sub-network clock wires for an exemplary 9 mm, 2 hierarchical entity with 205 splitters and 4000 master/slave latches. One of the sub-networks 51 and its connection to the structured clock buffer 50 is highlighted for clarity. In the example shown in FIG. 5, the structured clock buffer was placed on the left edge of the entity to bias the structured clock buffer toward the center of the chip, since the entity itself was placed on the right side of the chip (not illustrated).

In the example shown in FIG. 5, the resulting wire used for the clock distribution network was less than 1% of the metal density on the two planes used. The total capacitance at this stage was 28.8 pF, resulting in 63 mW of power dissipation at 300 MHZ.

The distribution of wire widths for the structured clock buffer clock distribution networks shows that 73% are minimum width (0.9 um), 21% are between 0.9 um and 4.5 um, and 6% are greater than 4.5 um, thus realizing the goal of only adding wire when necessary.

Figure 6:
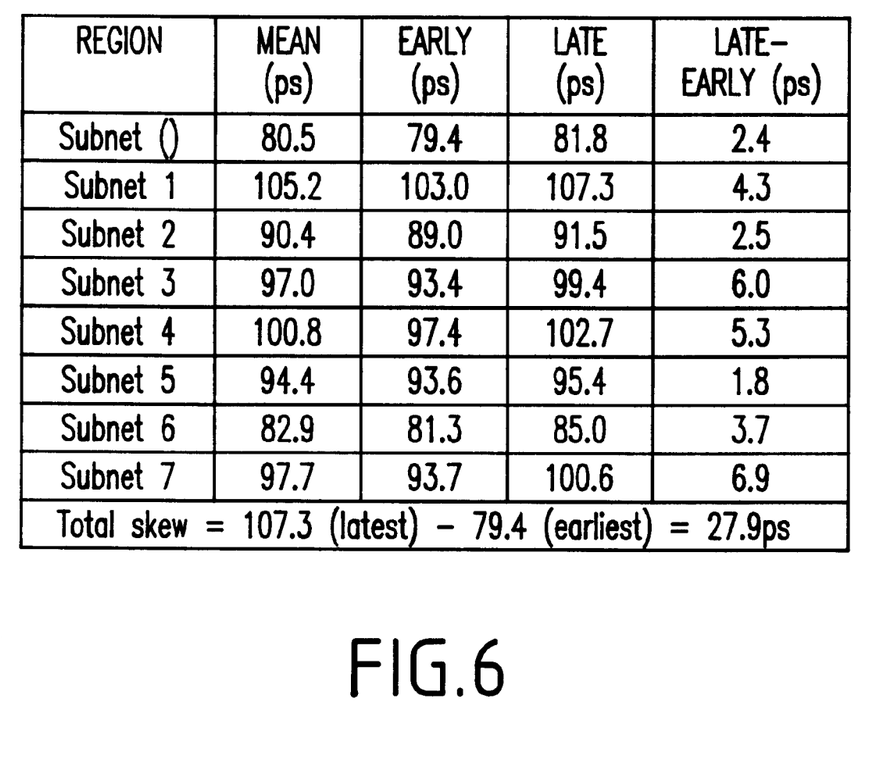
FIG. 6 is a chart illustrating the advantageous results achieved with the invention.

FIG. 6 illustrates that the design skew was 6.9 ps or less within each sub-network of the example shown in FIG. 5, and 27.9 ps or less for all 205 sinks on the structured clock buffer stage of the clock tree (note that the 6.9 ps skew of the sub-network is contained within the 27.9 ps skew at the structured clock buffer stage).

Thus, as shown above, less than 30 ps of skew can be achieved at the structured clock buffer stage for full chips as well as for hierarchical entities. An additional skew at the splitter-to-latch stage was determined to be consistently less than 35 ps, independent of design because the splitter-to-latch stage is always guaranteed to be a small area.

As mentioned above, a second structured clock buffer stage is sometimes necessary for extremely large chips with high latch counts and/or high frequencies. Each structured clock buffer stage adds another 30 ps of design skew. Because of the methodology's scalability, the same technique can be applied to hierarchical entities or full chips with comparable results. The total design skew of a chip (flat or hierarchical) is simply a function of the number of structured clock buffer stages and can be found as follows:

$$\text{skew}=(N*30 \text{ ps})+35 \text{ ps}$$

where N=number of structured clock buffer stages. Thus, even complex ASIC designs (ones with two or more structured clock buffer stages) will have less than 100 ps of skew.

Therefore, the present invention provides a structure and method for designing a clock distribution network which does not add unnecessary wiring, avoids power supply drops (which is commonly associated with localized high-current-density clock circuits) and reduces high-frequency effects, such as inductance.

The invention divides the circuit into balanced sub-networks (having the same capacitance and delay characteristics) and uses different sized structured clock buffers to precisely match the requirements of each of the sub-networks. In other words, the invention surveys the clock requirements of a given circuit and, based on the survey, divides the circuit into sub-networks, each of which is balanced within a given network. The invention also utilizes different sized structured clock buffers for each of the networks, depending on the networks' specific characteristics.

The invention works on a large variety of chip sizes, package types, latch counts and operating frequencies. The invention allows a complete automated design of the clock network, including verification.

The large structured clock buffer reduces the number of stages required, which correspondingly reduces complexity and clock skew. The structured clock buffer can be distributed to reduce resistance-capacitance effects when signals travel long distances. This makes the invention extremely useful in real world applications.

While the invention has been described in terms of preferred embodiments, those skilled in the art will recognize that the invention can be practiced with modification within the spirit and scope of the appended claims.

We claim:

1. An integrated circuit chip comprising:

a plurality of clock distribution sub-networks each including a clock input for receiving a clock signal; and at least one structured clock buffer having a size based on a load of said clock distribution sub-networks, and providing said clock signal to said clock distribution sub-networks, wherein said structured clock buffer includes an output pin, said clock input of each of said clock distribution sub-networks being directly connected to said output pin.

2. The integrated circuit chip of claim 1, wherein said clock input of each of said clock distribution sub-networks is connected to said output pin at generally equally spaced intervals along said output pin measured from each other and from ends of said output pin.

3. The integrated circuit chip of claim 1, wherein said clock distribution sub-networks comprise first clock distribution sub-networks and said structured clock buffer comprises a first structured clock buffer, said integrated circuit chip further comprising:
a plurality of second clock distribution sub-networks each including a second clock input for receiving said clock signal, each of said second clock distribution sub-networks having a second capacitance, as seen from said second clock input, substantially equivalent to others of said second clock distribution sub-networks; and
at least one second structured clock buffer having a second size based on a second load of said second clock distribution sub-networks, and providing said clock signal to said second clock distribution sub-networks.

4. The integrated circuit chip of claim 3, wherein said first structured clock buffer has a first output pin and a first input pin, and said second structured clock buffer has a second output pin and a second input pin, said integrated chip further comprising:
at least one third structured clock buffer having a third size, a third output pin, and providing said clock signal to said first structured clock buffer and said second structured clock buffer,
said first clock input of each of said first clock distribution sub-networks being connected to said first output pin of said first structured clock buffer at generally equally spaced intervals along said first output pin measured from each other and from ends of said first output pin,
said second clock input of each of said second clock distribution sub-networks being connected to said second output pin of said second structured clock buffer at generally equally spaced intervals along said second output pin measured from each other and from ends of said second output pin, and
said first input pin of said first structured clock buffer and said second input pin of said second structured clock buffer being connected to said third output pin of said third structured clock buffer at generally equally spaced intervals along said third output pin measured from each other and from ends of said third output pin.

5. The integrated circuit chip of claim 3, wherein said first structured clock buffer has a first delay and said second structured clock buffer has said first delay.

6. The integrated circuit chip of claim 1, wherein said clock input comprises a single clock input.

7. The integrated circuit chip of claim 1, wherein said output pin comprises a single output pin and said output pin extends along a length of said structured clock buffer.

8. The integrated circuit chip of claim 1, further comprising a power grid, wherein said structured clock buffer utilizes an unmodified version of said power grid to drive said clock distribution sub-networks.

9. The integrated circuit chip of claim 1, wherein said clock distribution sub-networks each include at least one group of master and slave latches and at least one group of splitters for supplying said clock signal to a corresponding one of said at least one group of master and slave latches.

10. The integrated circuit chip of claim 1, wherein said clock distribution sub-networks are capacitance balanced.

11. An integrated circuit chip comprising:
a plurality of first clock distribution sub-networks each including a first clock input for receiving a clock signal;
at least one first structured clock buffer having a first size based on a first load of said first clock distribution sub-networks, a first input pin, a first output pin and providing said clock signal to said first clock distribution sub-networks, said first clock input of each of said first clock distribution sub-networks being directly connected to said first output pin of said first structured clock buffer at generally equally spaced intervals along said first output pin measured from each other and from ends of said first output pin;
a plurality of second clock distribution sub-networks each including a second clock input for receiving said clock signal;
at least one second structured clock buffer having a second size based on a second load of said second clock distribution sub-networks, a second output pin, a second input pin, and providing said clock signal to said second clock distribution sub-networks, said second clock input of each of said second clock distribution sub-networks being directly connected to said second output pin of said second structured clock buffer at generally equally spaced intervals along said second output pin measured from each other and from ends of said second output pin; and
at least one third structured clock buffer having a third size, a third output pin, and providing said clock signal to said first structured clock buffer and said second structured clock buffer,
said first input pin of said first structured clock buffer and said second input pin of said second structured clock buffer being directly connected to said third output pin of said third structured clock buffer at generally equally spaced intervals along said third output pin measured from each other and from ends of said third output pin.

12. The integrated circuit chip of claim 11, wherein said first clock input comprises a single clock input and said second clock input comprises a single clock input.

13. The integrated circuit chip of claim 11, wherein:
said first output pin comprises a single output pin and said first output pin extends along a length of said first structured clock buffer,
said second output pin comprises a single output pin and said second output pin extends along a length of said second structured clock buffer; and
said third output pin comprises a single output pin and said third output pin extends along a length of said third structured clock buffer.

14. The integrated circuit chip of claim 11, further comprising a power grid, wherein said first structured clock buffer, said second structured clock buffer and said third structured clock buffer utilize an unmodified version of said power grid to drive said clock distribution sub-networks.

15. The integrated circuit chip of claim 11, wherein said first clock distribution sub-networks and said second clock distribution sub-networks each include at least one group of master and slave latches and at least one group of splitters for supplying said clock signal to a corresponding one of said at least one group of master and slave latches.

16. The integrated circuit chip of claim 11, wherein said first structured clock buffer has a first delay, said second structured clock buffer has said first delay and said third structured clock buffer has said first delay.

17. A scaleable structured clock buffer for driving clock distribution sub-networks, said structured clock buffer comprising:
at least one kernel comprising serially connected buffers and nodes positioned between said buffers, said nodes of one kernel of said at least one kernel being coupled to corresponding nodes of other ones of said at least one kernel, and a number of said at least one kernel included within said structured clock buffer being based on a load of said clock distribution sub-networks to be driven by said structured clock buffer; and an output pin for connecting directly to each of said clock distribution sub-networks.

18. The scaleable structured clock buffer of claim 17, wherein each of said at least one kernel includes four serially connected buffers.

19. The scaleable structured clock buffer as in claim 17, wherein said buffers comprise inverters.

20. The scaleable structured clock buffer of claim 17, wherein said output pin extends along a length of said structured clock buffer.

21. The scaleable structured clock buffer of claim 17, wherein a number of buffers included within each of said at least one kernel establishes a delay of said scaleable structured clock buffer.

22. A method of designing a clock distribution network comprising steps of:

identifying characteristics of structures within a circuit;

organizing said structures into balanced clock distribution sub-networks;

grouping said clock distribution sub-networks, to form at least one clock distribution network;

connecting a structured clock buffer directly to each of said at least one clock distribution network; and sizing said structured clock buffer based on a load of a corresponding one of said at least one clock distribution network.

23. The method of designing a clock distribution network of claim 22, wherein said identifying step, said organizing step, said grouping step, said assigning step and said sizing step are performed utilizing at least one automated planning program.

24. The method of designing a clock distribution network of claim 22, wherein said organizing step comprises a step of balancing said sub-networks according to a capacitance of said structures within said sub-networks.

25. The method of designing a clock distribution network of claim 22, wherein said sizing step comprises a step of defining a number of kernels within said structured clock buffer to match said load, wherein said kernels comprise serially connected buffers.

26. The method of designing a clock distribution network of claim 22, wherein said organizing step comprises steps of assigning master and slave circuits to said structures and assigning splitters to said master and slave circuits.

27. The method of designing a clock distribution network of claim 22, further comprising a step of defining connections between said structured clock buffer and an unmodified power grid.

28. The method of designing a clock distribution network of claim 22, wherein said identifying step comprises a step of identifying latency and capacitance characteristics of said structures.

29. A method of designing a clock distribution network comprising steps of:

identifying latency and capacitance characteristics of structures within a circuit;

organizing said structures into capacitance balanced clock distribution sub-networks;

grouping said clock distribution sub-networks, to form at least one clock distribution network;

connecting a structured clock buffer directly to each of said at least one clock distribution network;

sizing said structured clock buffer based on a load of a corresponding one of said at least one clock distribution network; and defining connections between said structured clock buffer and an unmodified power grid.

30. The method of designing a clock distribution network of claim 29, wherein said identifying step, said organizing step, said grouping step, said assigning step, said sizing step and said defining step are performed utilizing at least one automated planning program.

31. The method of designing a clock distribution network of claim 29, wherein said sizing step comprises a step of defining a number of kernels within said structured clock buffer to match said load, wherein said kernels comprise serially connected buffers.

32. The method of designing a clock distribution network of claim 29, wherein said organizing step comprises steps of assigning master and slave circuits to said structures and assigning splitters to said master and slave circuits.

* * * * *